United States Patent
Standing et al.

(10) Patent No.: US 9,281,260 B2
(45) Date of Patent: Mar. 8, 2016

(54) SEMICONDUCTOR PACKAGES AND METHODS OF FORMING THE SAME

(75) Inventors: Martin Standing, Villach (AT); Andrew Roberts, Wrexham (GB)

(73) Assignee: INFINEON TECHNOLOGIES AG, Neubiberg (DE)

( * ) Notice: Subject to any disclaimer, the term of this patent is extended or adjusted under 35 U.S.C. 154(b) by 467 days.

(21) Appl. No.: 13/415,556

(22) Filed: Mar. 8, 2012

(65) Prior Publication Data

US 2013/0234283 A1     Sep. 12, 2013

(51) Int. Cl.
| | | |
|---|---|---|
| H01L 21/00 | (2006.01) | |
| H01L 23/31 | (2006.01) | |
| H01L 23/538 | (2006.01) | |
| H01L 23/00 | (2006.01) | |
| H01L 21/56 | (2006.01) | |

(52) U.S. Cl.
CPC ........ *H01L 23/3185* (2013.01); *H01L 23/3135* (2013.01); *H01L 23/5389* (2013.01); *H01L 24/24* (2013.01); *H01L 24/25* (2013.01); *H01L 24/82* (2013.01); *H01L 21/568* (2013.01); *H01L 2224/04105* (2013.01); *H01L 2224/24227* (2013.01); *H01L 2224/2518* (2013.01); *H01L 2924/1306* (2013.01); *H01L 2924/13055* (2013.01)

(58) Field of Classification Search
None
See application file for complete search history.

(56) References Cited

U.S. PATENT DOCUMENTS

| | | |
|---|---|---|
| 5,886,398 A | 3/1999 | Low et al. |
| 6,238,954 B1 | 5/2001 | Ma et al. |
| 6,396,135 B1 | 5/2002 | Narvaez et al. |
| 6,437,240 B2 * | 8/2002 | Smith ........................... 174/541 |
| 6,713,317 B2 | 3/2004 | Knapp et al. |
| 6,747,341 B2 | 6/2004 | Knapp et al. |
| 6,991,996 B2 | 1/2006 | Sugatani et al. |
| 7,288,841 B2 | 10/2007 | Yamano |
| 7,294,529 B2 | 11/2007 | Tuominen |
| 7,759,785 B2 | 7/2010 | Corisis et al. |
| 7,872,343 B1 | 1/2011 | Berry |
| 7,954,081 B2 | 5/2011 | Bartley et al. |
| 8,004,096 B2 * | 8/2011 | Fukuzono ..................... 257/791 |
| 8,334,590 B1 * | 12/2012 | Jung et al. ..................... 257/698 |
| 2002/0064907 A1 | 5/2002 | Brand |
| 2003/0031830 A1 | 2/2003 | Sun et al. |
| 2003/0207492 A1 * | 11/2003 | Maeda et al. ................. 438/107 |
| 2005/0230746 A1 | 10/2005 | Eden et al. |

(Continued)

OTHER PUBLICATIONS

Blackshear, E.D., et al., "The evolution of build-up package technology and its design challenges," IBM J. Res & Dev., vol. 49, No. 4/5, Jul./Sep. 2005, ppl 641-661.

(Continued)

*Primary Examiner* — Angel Roman
(74) *Attorney, Agent, or Firm* — SpryIP, LLC

(57) ABSTRACT

In one embodiment, a method of fabricating a semiconductor package includes forming a first plurality of die openings on a laminate substrate. The laminate substrate has a front side and an opposite back side. A plurality of first dies is placed within the first plurality of die openings. An integrated spacer is formed around each die of the plurality of first dies. The integrated spacer is disposed in gaps between the laminate substrate and an outer sidewall of each die of the plurality of first dies. The integrated spacer holds the die within the laminate substrate by partially extending over a portion of a top surface of each die of the plurality of first dies. Front side contacts are formed over the front side of the laminate substrate.

24 Claims, 13 Drawing Sheets

(56) References Cited

U.S. PATENT DOCUMENTS

| | | | |
|---|---|---|---|
| 2005/0237598 A1 | 10/2005 | Malone | |
| 2006/0231939 A1* | 10/2006 | Kawabata et al. | 257/686 |
| 2008/0017409 A1* | 1/2008 | Takeuchi et al. | 174/260 |
| 2008/0041619 A1* | 2/2008 | Lee et al. | 174/260 |
| 2008/0115349 A1* | 5/2008 | Kim et al. | 29/830 |
| 2009/0283141 A1* | 11/2009 | Bentzen et al. | 136/256 |
| 2010/0052185 A1* | 3/2010 | Tojo et al. | 257/774 |
| 2010/0078205 A1* | 4/2010 | Sakai et al. | 174/260 |
| 2011/0241191 A1 | 10/2011 | Kurogi | |
| 2011/0244636 A1* | 10/2011 | Kondo | 438/127 |
| 2013/0093085 A1* | 4/2013 | Seah | 257/738 |

OTHER PUBLICATIONS

Wojnowski, M., et al., "Package Trends for Today's and Future mm-Wave Applications," The 38th European Microwave Conference, 2008, 55 pages.

* cited by examiner

SEMICONDUCTOR PACKAGES AND METHODS OF FORMING THE SAME

TECHNICAL FIELD

The present invention relates generally to a semiconductor devices, and more particularly to semiconductor packages and methods of forming the same.

BACKGROUND

Semiconductor devices are used in many electronic and other applications. Semiconductor devices comprise integrated circuits or discrete devices that are formed on semiconductor wafers by depositing many types of thin films of material over the semiconductor wafers.

Semiconductor devices are packaged using various packaging technologies. Conventional printed circuit boards consist of a core member or layer—generally referred to as PCB core laminate layer—and one or more additional layers laminated on either side of the core layer. A PCB may include a plurality of conductive and insulating layers sandwiched together. The insulating layers may be a fiberglass sheet or other dielectric material for electrically isolating the conductive layers and for providing structural strength for mounting components. The fiberglass sheet may be impregnated with resin or epoxy, which is a family of thermosetting resins used to form a bond with metal. The conductive layers are typically made of copper foil, which are laminated to the insulation layer using heat and pressure. The copper foil is etched to form signal traces providing the conductive pathways for the electrical signals. Holes or interconnect vias are usually drilled or punched to provide a conductive path between certain traces on different layers. Typically a printed circuit board (PCB) is populated with components post manufacture and in the case of the semiconductor devices, these are supplied as packaged devices. These packaged devices can be in many forms including over-molded through hole or surface mount devices or ball grid array (BGA), Plastic Ball Grid Array (PBGA), Flip-chip chip scale package (CSP) (FCBGA).

Semiconductor packages have to provide outstanding performance without increasing cost. Designs must continue to push the boundaries of performance and leverage more efficient manufacturing methods to achieve cost reductions.

SUMMARY OF THE INVENTION

These and other problems are generally solved or circumvented, and technical advantages are generally achieved, by illustrative embodiments of the present invention.

In accordance with an embodiment of the present invention, a method of fabricating a semiconductor package comprises forming a first plurality of die openings on a laminate substrate. The laminate substrate has a front side and an opposite back side. The plurality of first dies is placed within the first plurality of die openings. An integrated spacer is formed around each die of the plurality of first dies. The integrated spacer is disposed in gaps between the laminate substrate and an outer sidewall of each die of the plurality of first dies. The integrated spacer holds or secures the die within the laminate substrate by partially extending over a portion of a top surface of each die of the plurality of first dies. Front side contacts are formed over the front side of the laminate substrate.

In accordance with an alternative embodiment of the present invention, a method of fabricating a semiconductor package comprises forming a first plurality of die openings and a plurality of through openings on a laminate substrate. A plurality of first dies is placed within the first plurality of die openings. An integrated spacer is formed around each die of the plurality of first dies. The integrated spacer is disposed in gaps between the laminate substrate and an outer sidewall of each die of the plurality of first dies. The integrated spacer holds the die within the laminate substrate by partially extending over a portion of a top surface of each die of the plurality of first dies. The plurality of through openings is filled with a conductive material. Contacts are formed over the laminate substrate. At least some of the contacts coupled to backside contacts under the plurality of first dies.

In accordance with an alternative embodiment of the present invention, a semiconductor package comprises a laminate substrate having a first die opening, a first die disposed within the first die opening, and a first spacer disposed within a first gap between the laminate substrate and the first die. The first spacer is disposed around a perimeter of the first die. The first spacer covers a portion of a top surface of the first die and a portion of an opposite bottom surface of the first die.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a semiconductor package fabricated in accordance with embodiments of the present invention, wherein FIG. 1A illustrates a top view and FIGS. 1B and 1C illustrate different cross-sectional views;

FIG. 2 illustrates a laminate substrate used in various embodiments of the invention, wherein

FIG. 3 illustrates a laminate substrate after removing a portion of the metal layers in various embodiments of the invention, wherein

FIG. 4 illustrates a laminate substrate after mounting the laminate substrate on a carrier and placing dies within the die openings in various embodiments of the invention, wherein

FIG. 5, which includes FIGS. 5A-5D, illustrates a laminate substrate after forming a partial spacer structure in accordance with an embodiment of the invention, wherein FIG. 5A illustrates a top view and FIG. 5B illustrates a magnified cross-sectional view;

FIG. 7 illustrates a laminate substrate after plating both sides of the laminate substrate in accordance with an embodiment of the invention, wherein

FIG. 9, which includes FIGS. 9A and 9B, illustrates the semiconductor package being fabricated after forming the circuit interconnecting the dies in accordance with an embodiment of the invention, wherein FIG. 9A illustrates a top view and FIG. 9B illustrates a cross-sectional view;

FIG. 10, which includes FIGS. 10A and 10B, illustrates the semiconductor package being fabricated after forming a solder mask in accordance with an embodiment of the invention, wherein FIG. 10A illustrates a top view and FIG. 10B illustrates a cross-sectional view;

FIG. 12, which includes FIGS. 12A and 12B, illustrates a semiconductor package after singulation in accordance with embodiments of the invention, wherein FIG. 12A illustrates the top side and FIG. 12B illustrates the back side.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
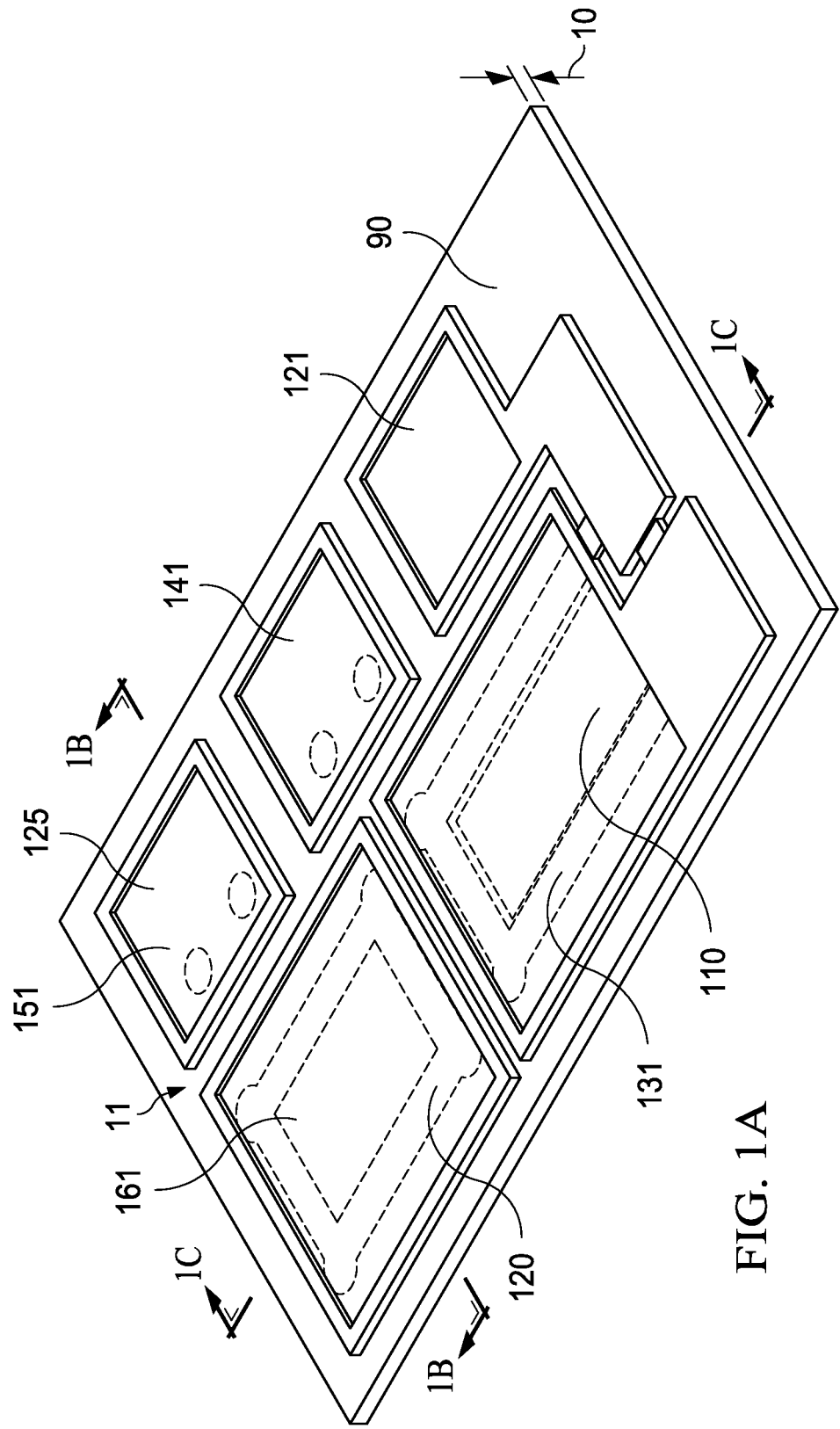

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In semiconductor technologies, FoM (Figure of Merit) and circuit efficiency have been continuously improved by scaling from one technology node to another while reducing cost per transistor. Connection areas are also scaled during device scaling, which increases power density per given area. Improvements in packaging are required to prevent parasitic elements from the package overwhelming the improvements made within the semiconductor die. Therefore, connections have to be made to the semiconductor device that best use the available area of the die. These connections have to terminate in contact areas and pitches that are compatible with conventional electronic assembly methods used by the component user, such as surface mounting technologies.

Conventional semiconductor packaging technologies use solder, conductive glue and other methods of attaching die (chip) to conductors, which result in relatively high loss connection paths. Even with the best practices, the action of all "soldering" operations result in relatively high impedance intermetallic formations.

The connection methods conventionally used on the front side of the die (chip) are even worse. Wire-bonding, ribbon-bonding and clip bonding result in relative small cross-sectional area conduction paths. As the chips get smaller, the problems increase as the physical connection area decreases and methods such as wire-bonding, clip-bonding become difficult to implement. More recently, technologies have started to utilize semi-embedded and embedded technologies. However, these technologies use micro-via technologies with limitations on connection cross-sectional dimension and via pitch (distance between adjacent vias), which result in increasing current densities and thermal conductivities with further scaling.

In various embodiments, the present invention teaches various methods of increasing the contact area and quality of contact to both sides of the semiconductor dies and such packages.

Various embodiments of the present invention achieve many advantages by utilizing a core laminate having a thickness similar to the dies. The core laminate acts as a structural foundation for all subsequent building stages, which are based on sequential build-up technologies. This approach brings numerous advantages throughout the assembly processes. The first of the advantages is that the entire technology uses very inexpensive materials and has very little waste and a low number of processing stages, which results in a simple and inexpensive end product. The sequential build-up method means that the openings to the die may be formed using a photo-imaging dielectric. This allows large area connections to be formed in any shape or form as required by the package and circuit layout. Advantageously, this is achieved without complex processing and technologies.

Figure 1B:
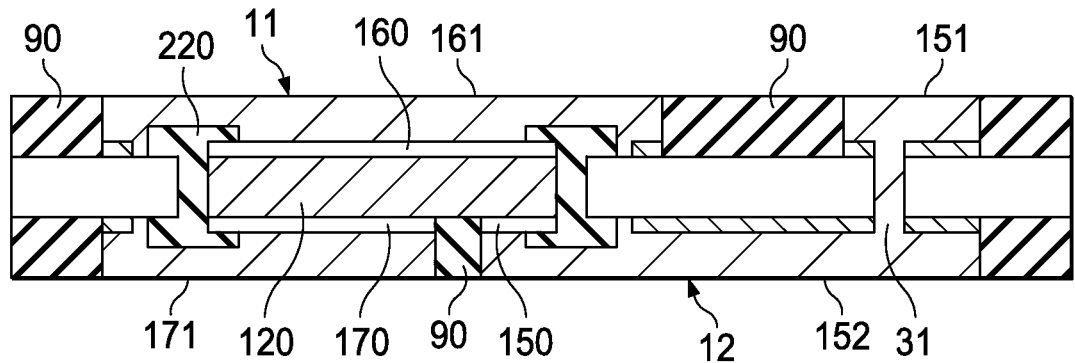
Figure 1C:
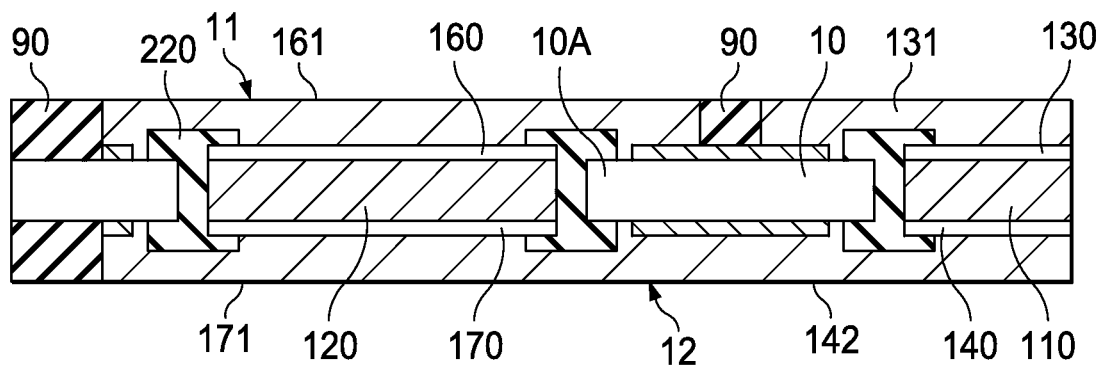

FIG. 1, which includes FIGS. 1A-1C, illustrates a semiconductor package fabricated in accordance with embodiments of the present invention, wherein FIG. 1A illustrates a top view and FIGS. 1B and 1C illustrate different cross-sectional views.

Referring to FIG. 1A, the semiconductor package comprises a plurality of dies embedded within a laminate substrate 10 (see also the cross-sectional views of FIGS. 1B and 1C). For example, the package includes a first die 110 and a second die 120. The first and the second dies 110 and 120 have a plurality of contacts 125 or contact pads for making external contact, input/output and others. As an example, the plurality of contacts 125 include a first gate contact 121 coupled to the gate of the first die 110, first source contact 131 coupled to the source of the first die 110, and a common source/drain contact 141 coupled to the drain of the first die 110. Similarly, the plurality of contacts 125 include a second gate contact 151 coupled to the gate of the second die 120 and a second drain contact coupled to the drain of the second die 120. In various embodiments, more or less number of contact pads may be present depending on the type of the dies. The above example illustrates one way of packaging and connecting discrete transistor dies. As illustrated, the contact regions are surrounded by a dielectric layer 90.

Referring to FIG. 1B, the dies are disposed in a laminate substrate 10. Each of the die is separated by a region of the laminate substrate 10 as evidenced by a portion 10A (FIG. 1C) of the laminate substrate 10 separating the first die 110 from the second die 120.

An integrated spacer 220 is disposed in a gap between the die and the laminate substrate 10. In various embodiments, the integrated spacer 220 is also disposed over a portion of the dies thereby mechanically holding or securing the dies. For example, in the illustrated embodiment, the integrated spacer 220 has a cross-sectional shape of an "I" or a rotated "H."

Other shapes that cover the top surface and the bottom surface of the dies may be used in various embodiments. The integrated spacer 220 advantageously holds the dies within the laminate substrate 10 during processing and subsequently during the product life time. In various embodiments, at least a portion of the perimeter of the die has an "I" section. In some embodiments, some portion but not all of the perimeter of the die has an "I" section.

The back side contacts, if any, may be coupled to the front side using through vias 31 and back side and front side redistribution tracks or traces. As an illustration, the second drain contact region 160 on the second die 120 has a thick conductive pad region (second drain contact 161). The second gate contact region 150 is coupled to the second gate contact 151 on the front side 11 using through vias 31 and the back side gate conductor 152.

Similarly, referring to FIG. 1C, the back side contact region (second source contact region 170) is coupled through the second source contact conductor 171 to the first drain contact conductor 142 under the first drain contact region 140, which is coupled to the common source/drain contact 141 (FIG. 1A).

The actual circuitry illustrated above is an example, and in various embodiments, any required circuit may be used. The circuit illustrated above is a simple high-side/low-side half bridge layout, which may be used in a synchronous buck application. The circuit is one possible application for a vertical conduction circuit, which may be used in conjunction with passive components in other embodiments as described in further detail in co-pending application, application Ser. No. 13/232,803, filed on Sep. 14, 2011, which application is incorporated herein by reference. In the illustrated embodiments described in the present invention, the laminate substrate 10 is quite thin. However, embodiments of the invention may be also used for further embedding dies into multi-layer printed circuit boards.

In one or more embodiments, the present invention teaches constructing an ultra-thin package having a total thickness of less than about 100 μm, and about 50 μm to about 100 μm, although the package thickness may be about 200 μm to about 300 μm in an alternative embodiment.

FIG. 2-12 illustrates a semiconductor package in various stages of fabrication in accordance with embodiments of the invention.

Whilst the following process description teaches forming a package with vertical semiconductor dies, i.e., dies having contacts on both surfaces, there are no limitations to the technology that prevents or impedes the production of circuits with all nodes on a single surface, upper or lower.

Figure 2A:
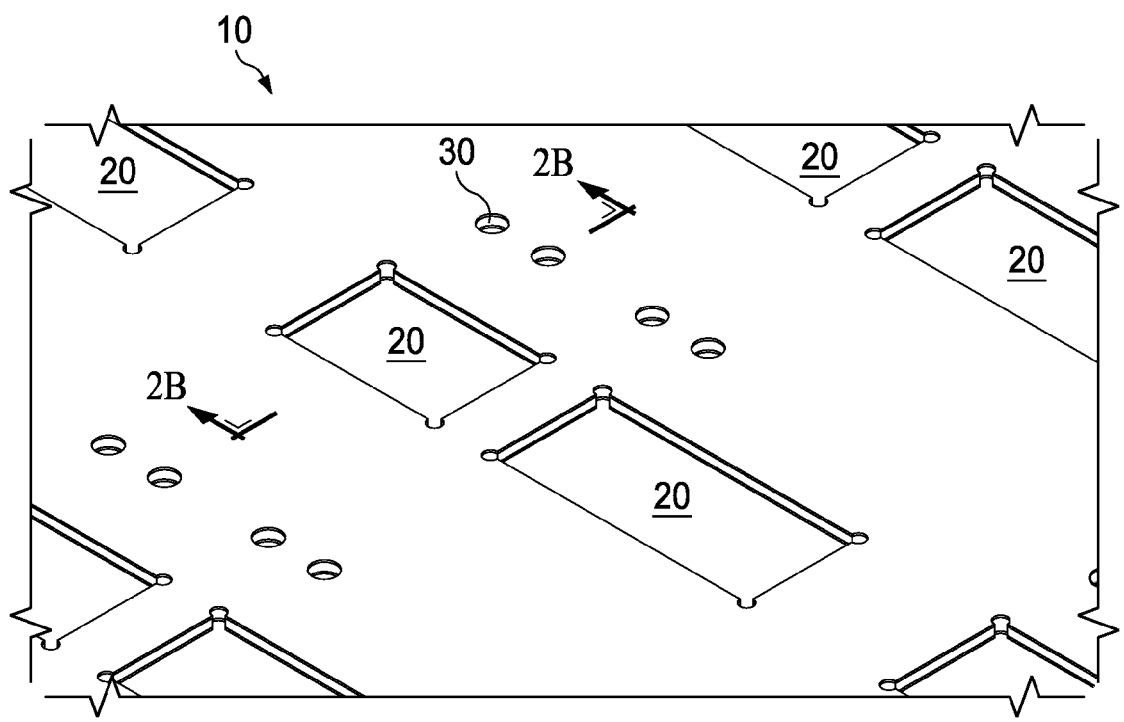
FIG. 2A illustrates a top view and FIG. 2B illustrates a magnified cross-sectional view.
Figure 2B:
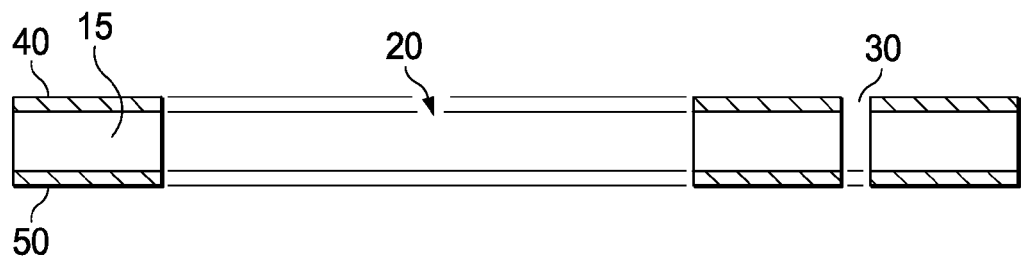

FIG. 2 illustrates a laminate substrate 10 used in various embodiments of the invention, wherein FIG. 2A illustrates a top view and FIG. 2B illustrates a magnified cross-sectional view. The laminate substrate 10 has a core material layer 15 covered on the top and bottom with an upper metal layer 40 and a lower metal layer 50 as illustrated in the cross-sectional view of FIG. 2B. The core material layer 15 may comprise a glass fiber reinforced epoxy in one embodiment. In various embodiments, the upper and the lower metal layers 40 and 50 comprise copper. In one or more embodiments, the upper and lower metal layers 40 and 50 are pre-laminated to the top and bottom surfaces of the core material layer 15. This laminate substrate 10 having such a structure may be referred as a core laminate in the field of printed circuit board (PCB) manufacture.

In various embodiments, the metal in the upper and the lower metal layers 40 and 50 is pre-treated and roughened before lamination to the core material layer 15, which is normally, although not exclusively, organically based. Therefore, the upper and the lower metal layers 40 and 50 advantageously have a very high peel strength. In contrast, in conventional processing, metals layer with high peel strength are not achievable where metal layers are deposited over non-metallic materials during subsequent processing, e.g., during formation of redistribution lines.

Examples of materials that may be used as the core material layer 15 include FR4 materials (epoxy phenolic or epoxy novolac materials), bimaleimide (BT) materials, polyimide, cyanate-esters, ceramic, mineral based laminates, glass like amorphous materials. The core material layer 15 may be reinforced with glass weaves, papers, fibres or fillers especially when the material of the core material layer 15 is an organic material.

In various embodiments, the thickness of the laminate substrate 10 is about the same as the die to be packaged within it. For example, when a thickness of the die to be placed is about 100 μm, then a thickness of the core material layer 15 may be about 80 μm while the upper and the lower metal layers 40 and 50 may each be about 10 μm thick so that the total thickness of the laminate substrate 10 is also about 100 μm. In various embodiments, the thickness ratios between the core material layer 15 and the upper and the lower metal layers 40 and 50 may be varied so as to generate about the same overall thickness. In various embodiments, the thickness of the core material layer is about 70% to about 90% of the thickness of the die to be packaged.

As illustrated in FIGS. 2A and 2B, a plurality of openings is formed in the laminate substrate 10. In various embodiments, the plurality of openings may be formed at this stage of processing or subsequently depending on available process choices.

In various embodiments, the plurality of openings may be formed using a variety of technologies such as drilling, routing, punching, chemical machining, laser ablation, laser cutting, plasma etching, water-jet cutting, and others.

The plurality of openings include a die opening 20 for the dies to be placed and a through opening 30 for electrically connecting the backside contact of the dies (if any) to the front side. In various embodiments, the die opening 20 is cut to be slightly larger than the die to be placed so that the die fits within the die opening 20 easily and to allow for some inaccuracy during die placement. In one or more embodiments, the difference in width of the die opening 20 with the width of the die to be placed is about 50 μm per side, and about 20 μm to about 100 μm per side in various embodiments (see FIG. 4B showing the width of the gap Wg). This gap may be dependent on several factors such as cutting accuracy, stability of the laminate material and die placement accuracy. As illustrated, the die openings 20 may have additional shapes/structures at the corners to enhance the mechanical stability of holding the dies.

Figure 3A:
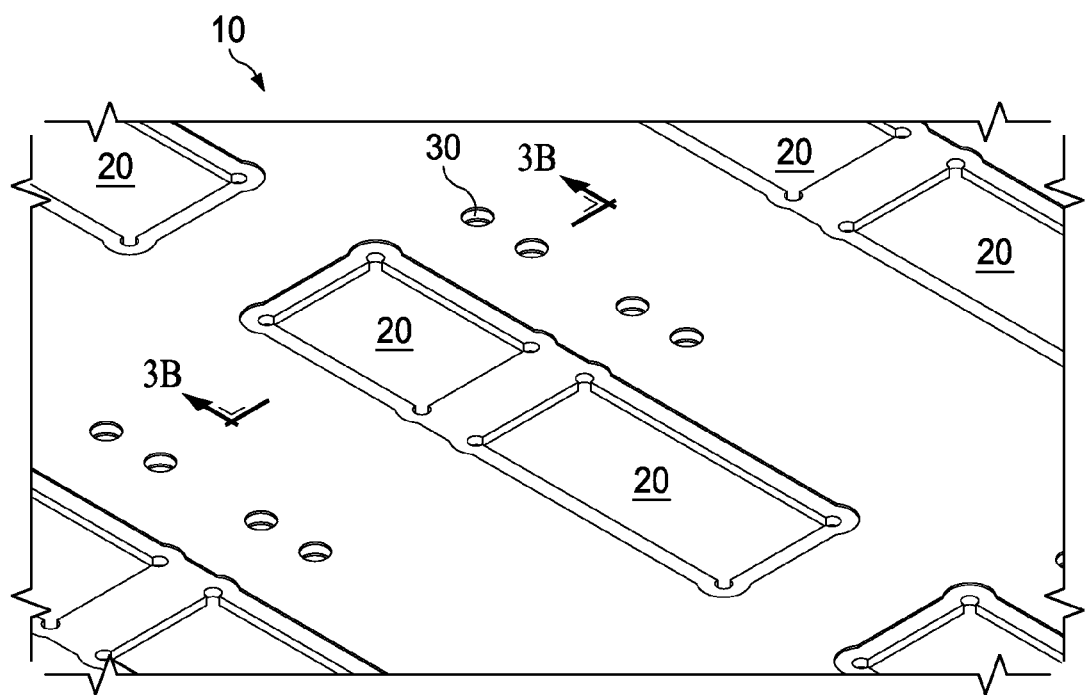
FIG. 3A illustrates a top view and FIG. 3B illustrates a magnified cross-sectional view.
Figure 3B:
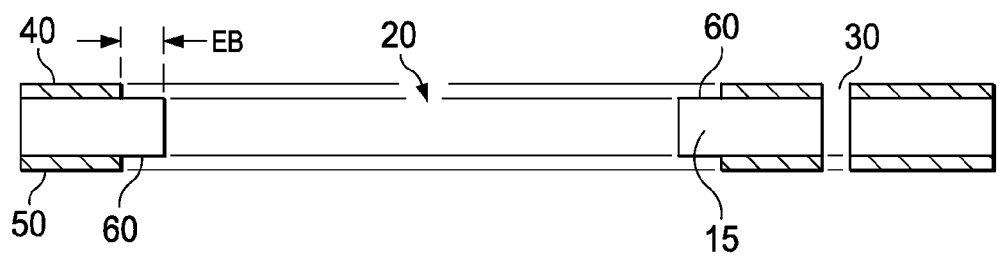

FIG. 3 illustrates a laminate substrate after removing a portion of the metal layers in various embodiments of the invention, wherein FIG. 3A illustrates a top view and FIG. 3B illustrates a magnified cross-sectional view.

Referring to FIG. 3A, the upper and lower metal layers 40 and 50 are removed from around the edge of the die opening 20. The metallic material is removed to avoid metal shorts. Therefore, the metal layers are removed from both the top and bottom of the laminate substrate 10. In various embodiments, the upper and the lower metal layers 40 and 50 are removed using a etch process to form etch back regions 60 as illustrated in FIG. 3B. The etch back process may be performed after forming a resist that protects the regions of the metal that are not to be etched.

In one or more embodiments, the upper and the lower metal layers 40 and 50 are removed by about a etch back distance EB. The etch back distance EB may be dependent on the subsequent processing capabilities in various embodiments. In one or more embodiments, the etch back distance EB is about 100 μm to about 500 μm. This is removed with a metal etching process in one embodiment. As mentioned above with respect to FIG. 2, in some embodiments, the order of cutting the laminate substrate 10 and etching the metal layers may be exchanged depending on the processes used.

Figure 4A:
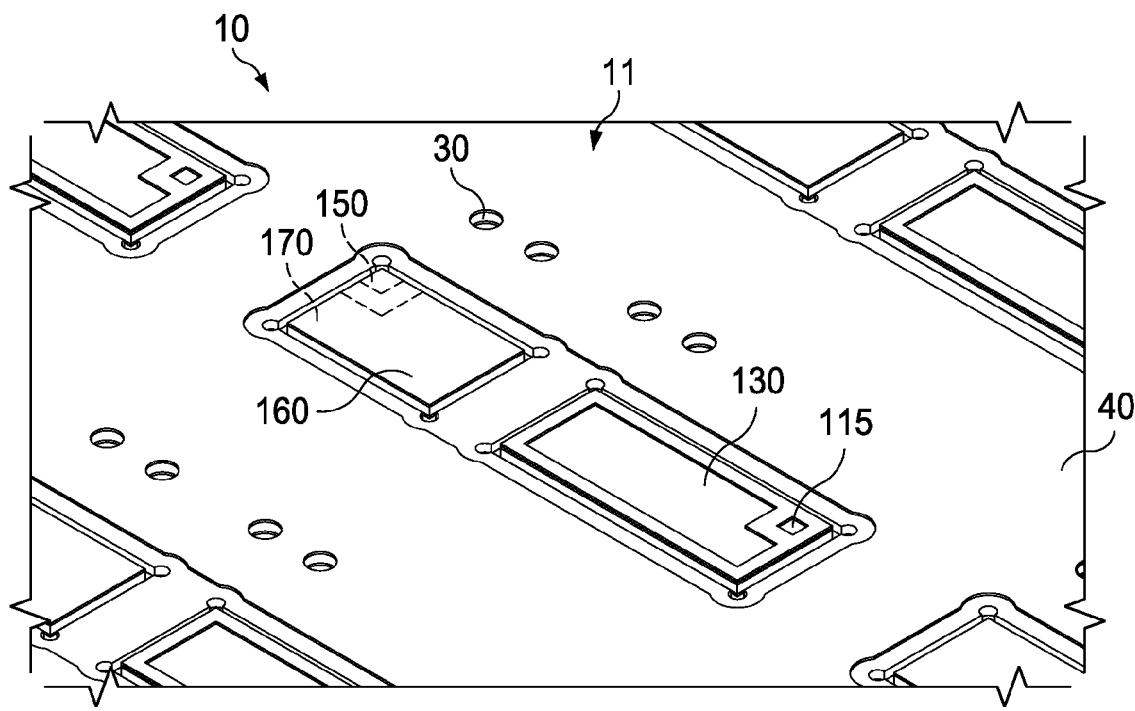
FIG. 4A illustrates a top view and FIG. 4B illustrates a magnified cross-sectional view.
Figure 4B:
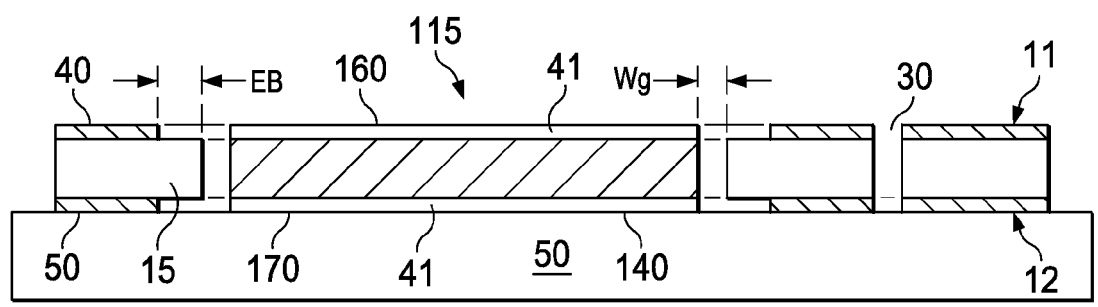

FIG. 4 illustrates a laminate substrate after mounting the laminate substrate on a carrier and placing dies within the die openings in various embodiments of the invention, wherein FIG. 4A illustrates a top view and FIG. 4B illustrates a magnified cross-sectional view.

Referring to FIG. 4B, the laminate substrate 10 is mounted on a carrier 50. Thus, the front side 11 of the laminate substrate 10 remains exposed while the back side 12 is supported on the carrier 50. The carrier 50 may comprise a rigid carrier or may be a tape. In case of a rigid substrate, a top layer of the carrier 50 may include an adhesive layer for holding the laminate substrate 10 during processing.

The dies are then placed into the die openings 20. In various embodiments, the dies may be placed both ways up. For example, with conventional vertical field effect transistor (FET) devices, the gate and source may be facing up or down. The configuration of the dies within the assembly is dependent on the circuit configuration and may be any layout.

FIG. 4B also illustrates the etch back distance EB described earlier, and the width of the gap Wg between the dies (e.g., first die 110) and the laminate substrate 10.

As an illustration, FIG. 4A shows a top surface of first die 110 having a first gate contact region 115 and a first source contact region 130 placed within a first die opening. The first die 110 also includes a first drain contact region 140 on the bottom side. A second die 120 having a second drain contact region 160 on one surface is placed within an adjacent second die opening 20, which is shown in FIG. 3B. The second die 120 has a second gate contact region 150 and a second source contact region 170 on an opposite side. The contact regions of the first die 110 and the second die 120 comprise a conductive material 41, which may comprise copper or aluminum in one embodiment.

Advantageously, in various embodiments, the semiconductor dies/chips may be easily placed either way up within the laminate substrate 10.

Figure 5A:
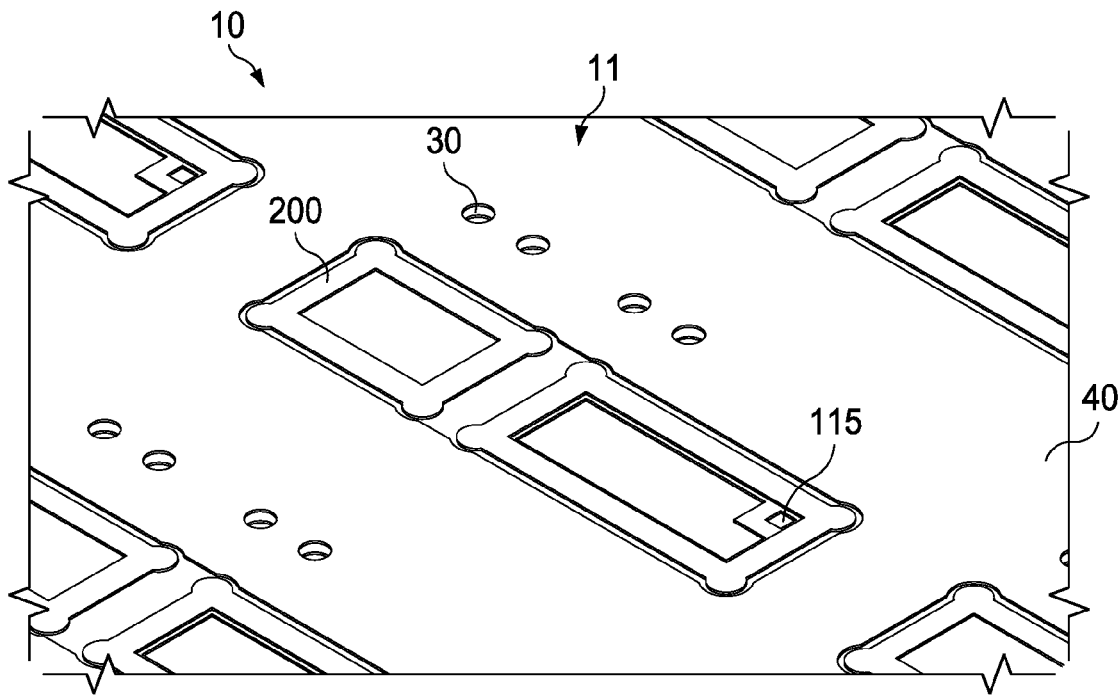
Figure 5B:
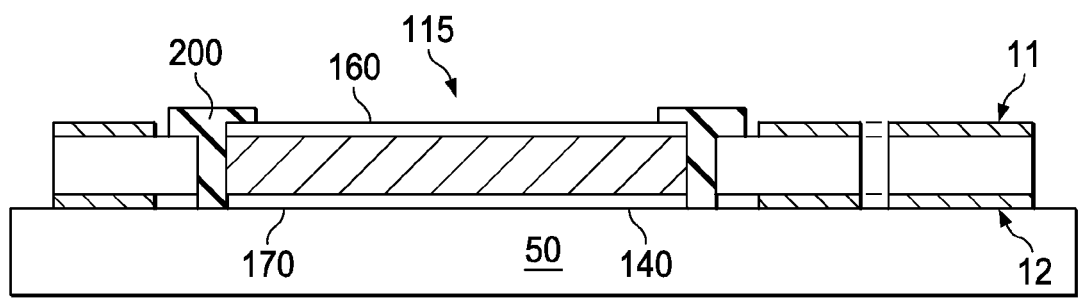

FIG. 5, which includes FIGS. 5A-5D, illustrates a laminate substrate after forming a partial spacer structure in accordance with an embodiment of the invention, wherein FIG. 5A illustrates a top view and FIG. 5B illustrates a magnified cross-sectional view.

After placing the dies within the die openings 20, a partial spacer 200 is deposited from the front side 11 of the laminate substrate 10. Consequently, the partial spacer 200 is formed along the perimeter of the first and the second dies 110 and 120 (FIG. 5A). The partial spacer 200 also extends over the top surface of the first die 110 and the second die 120.

The partial spacer 200 holds the dies in place when the laminate substrate 10 is inverted. The partial spacer 200 also protects the edge of the die and may also act as a dielectric for the patterning of the contacts to the die. The partial spacer 200 may also be used directly to form the dielectric layer to pattern the die contacts. The partial spacer 200 may be used to complement existing dielectric layers already deposited at the die level. Alternatively, an additional dielectric layer may be printed over the partial spacer 200 to pattern the die contacts.

The partial spacer 200 may be deposited in several ways in various embodiments including using screen printing, flood coating, curtain coating, spray deposition etc. The material of the partial spacer 200 may be a photo-imaging or photo-patterning material in one embodiment for ease of processing and improving patterning accuracy. In one embodiment, a pattern screen printing process is used along with photo-imaging to precisely pattern the material. This system as described further below reduces wasted material and utilizes the strengths of both processes.

In various embodiments, the spacer structure may be created in at least two steps and deposited from both top and bottom surfaces. In one case, the spacer structure could be deposited as a patterned structure using a mesh screening process with a stencil (sometimes referred to as silk-screening, which is a process still used in PCB manufacturing). Alternatively, in one embodiment, the spacer structure may be deposited using metal stencil printing. However, for very fine geometries as may be used in embodiments of the invention, these technologies which are more adept for larger features may not be optimal.

In accordance with various embodiments of the invention, the spacer structure is formed using a printing process such as a screen printing process but using a stencil to print only a relatively small area, which would then be processed with a lithographic process (photo-imaging) and excess material would then be developed away.

Figure 5C:
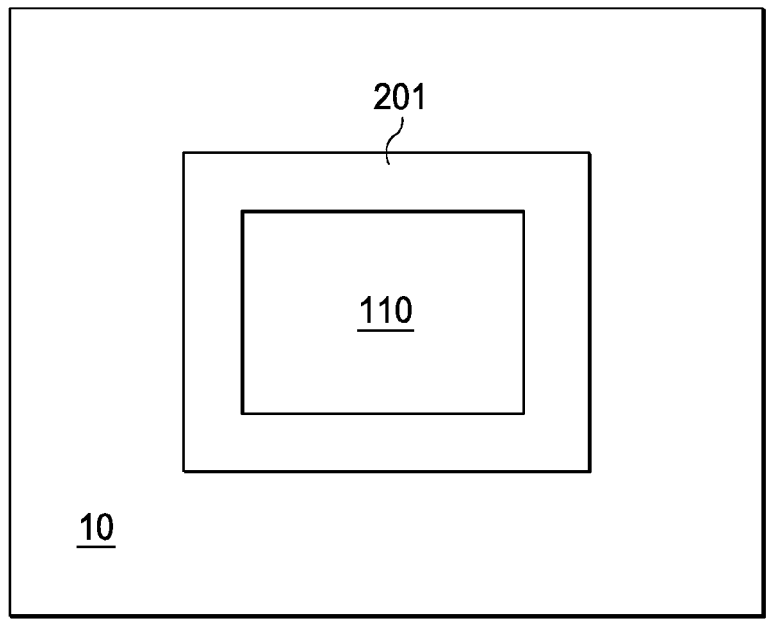

As illustrated in FIG. 5C, for example, a perimeter stencil print 201 may be deposited around the die edge of the first die 110 using a screen printing process. The thickness of the perimeter stencil print may be about a few mm, e.g., 2 mm, as allowed by the process limitations. In various embodiments, the spacer material may be printed as a liquid or a paste.

Figure 5D:
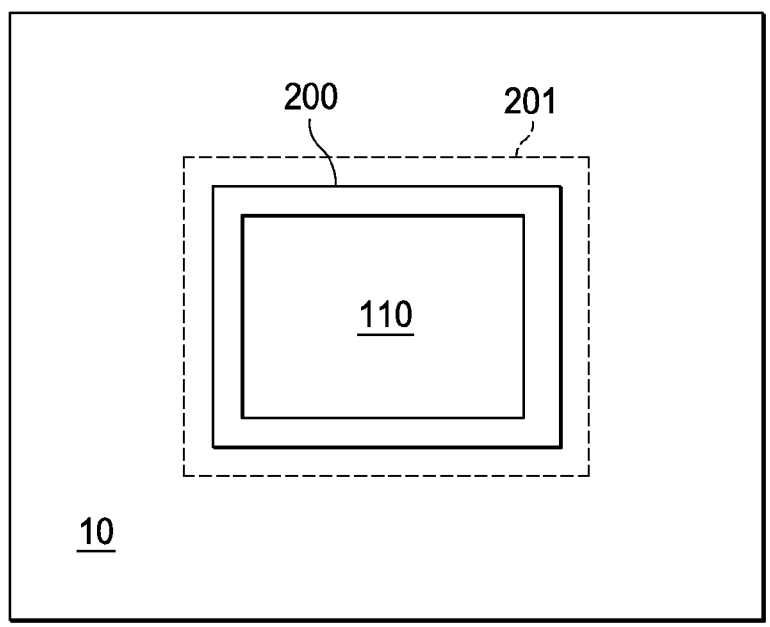

Next, as illustrated in FIG. 5D, the perimeter stencil print 201 may be exposed using a lithographic process and the excess material developed away. For example, the thickness of the perimeter stencil print may be reduced from a few mms, e.g., 2 mm, to a few hundred microns, e.g., 200 μm thereby forming the partial spacer 200. The spacer material fills the gaps between the first die 100 and the laminate substrate 10. The structure after depositing the spacer material is illustrated in FIG. 5B.

Additionally, in many cases, the technology may require a dielectric layer to define and perhaps separate the contact areas of the die. So, for example, the design may incorporate a driver IC having closely spaced together pads. Alternatively, a dielectric layer may be needed because a greater distance may need to be created between the gate to source region (emitter to base on an IGBT) in a power die. When the spacer material is the same as the dielectric layer, then the dielectric layer may be created as part of the spacer creation step, e.g., by screen printing and photo-imaging. In other embodiments, the spacer material may be different from the dielectric layer material.

In alternative embodiments, the materials for forming the spacer structure and the dielectric layer may be deposited by spraying, curtain coating, dip-coating, dispensing, and others processes known to a person having ordinary skill in the art. However, these alternative processes cover the entire laminate substrate with material, so that most of the material would have to be removed in the subsequent photo-imaging/developing process. Advantageously, using screen/stencil printing as described above reduces material wastes and reduces costs by reducing the amount of material to be removed during the developing process.

In one or more embodiments, the spacer materials used to form the spacer structure 200 and integrated spacer 220 are photo-imaging materials so that they can be photo-imaged as described above. Photo-imaging materials are available for many applications such as dielectrics and solder-masks. Photo-imaging materials are often based on epoxy systems and may be photoresists. The spacer material may be based on a number of potential polymer chemistries including epoxy resins, acrylate systems, cyanate esters etc.

In alternative embodiments, a selective ultra violet (UV) curing process may be used instead of the photo-imaging. Accordingly, the spacer material may also be a UV curing material. Once these are selectively UV cured, then excess material may be removed, e.g., rinsed away, in a similar way to a photo-imaging developing process.

In some embodiments, while the laminate substrate 10 is on the carrier 50, a thermal process is performed after depositing the material of the spacer 300. The thermal process cures the spacer material to form the partial spacer 200. After the thermal process, the laminate substrate 10 is removed from the carrier 50. The partial spacer 200 holds the dies and prevents the dies from falling out of the laminate substrate 10.

Figure 6:
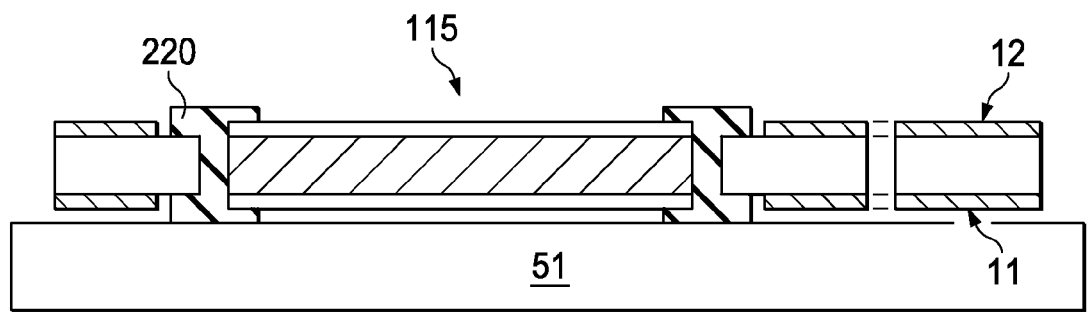
FIG. 6 illustrates a cross-sectional view of a laminate substrate after forming an integrated spacer structure in accordance with an embodiment of the invention.

FIG. 6 illustrates a cross-sectional view of a laminate substrate after forming a spacer structure in accordance with an embodiment of the invention.

Referring to FIG. 6, the laminate substrate 10 is removed from the carrier 50 and the front side 11 is placed on a carrier 51. In some embodiments, an additional carrier may not be needed as the partial spacer 200 may support the dies. The spacer material is deposited from the back side 12 of the laminate substrate 10. The spacer material may be the same material as described above in one embodiment. In alternative embodiments, the spacer material deposited on the back side 12 may be different from the spacer material deposited on the front side 11.

After the spacer material is deposited another thermal curing may be performed to form the integrated spacer 220. The integrated spacer 220 forms a single structure comprising the spacer material deposited and cured from the front side 11 and the back side 12. The integrated spacer 220 has an "I" shape such that at least a portion of the integrated spacer 220 covers the top surface of the laminate substrate 10 and the top surface of the dies. Similarly, a portion of the integrated spacer 220 covers the bottom surface of the laminate substrate 10 and the bottom surface of the dies.

Thus, in one or more embodiments, the present invention teaches methods for retaining or holding dies within a core laminate such as the laminate substrate 10, for example, during processing. A photo-imaging or ultra-violet curing spacer material is used to retain the die in one embodiment. The integrated spacer 220 is formed around the perimeter of the semiconductor die/chip and the edge of the die openings 20 in the laminate substrate 10. The finished spacer, which is a highly engineered polymer material, forms a "I" section structure, which extends onto the semiconductor device surface and the surface of the laminate substrate 10. Such a spacer structure retains, protects, and forms a strong structural part of the packaging architecture.

Figure 7A:
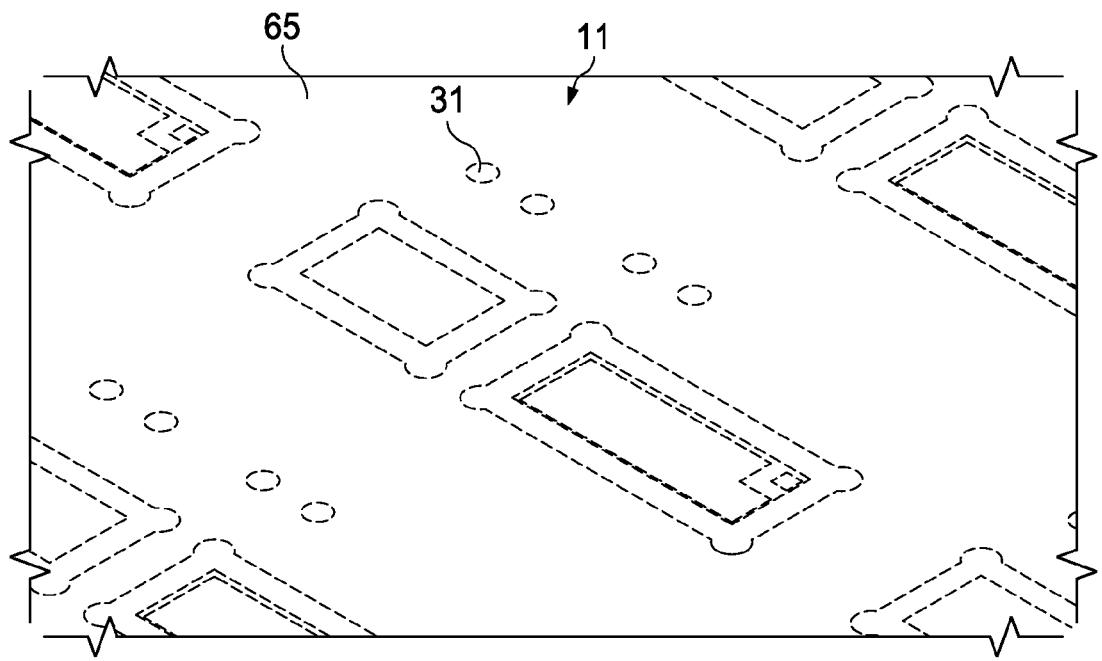
FIG. 7A illustrates a top view and FIG. 7B illustrates a magnified cross-sectional view.
Figure 7B:
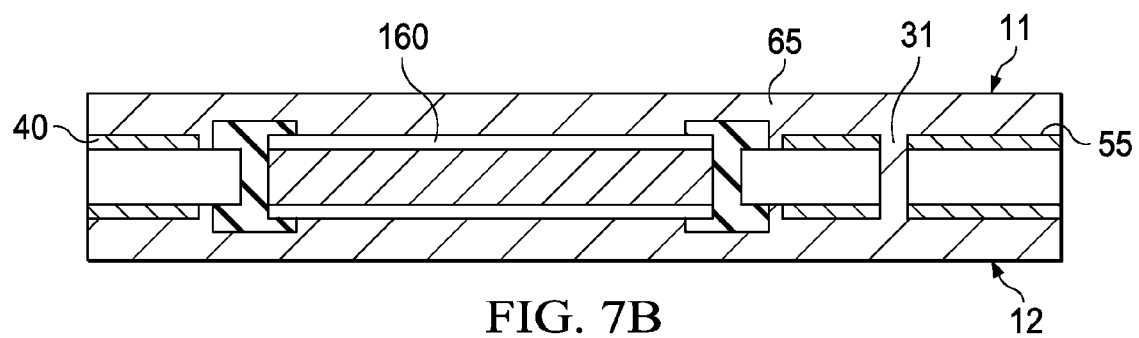

FIG. 7 illustrates a laminate substrate after forming a partial spacer structure in accordance with an embodiment of the invention, wherein FIG. 7A illustrates a top view and FIG. 7B illustrates a magnified cross-sectional view.

After the integrated spacer 220 is formed, the laminate substrate 10 may be removed from any supporting carrier 50. The laminate substrate 10 is subjected to a metallization process. Advantageously, the technology of die attach requires no subsequent processing to clean residuals from the spacer or patterning processing. However, surface preparation/activation of the metal and non-metallic surfaces may be required prior to metallization in some embodiments. In various embodiments, the surface preparation techniques such as acid or alkali rinses, mild surface abrasion, plasma and oxygen washes may be employed prior to this process stage.

Embodiments of the invention advantageously use an electro-less plating technology to simultaneously process both sides of the laminate substrate 10. During electro-less plating, the laminate substrate 10 including the dies is immersed in a plating bath. Thus, both sides are exposed to the plating bath and therefore processed at once. In one or more embodiments, the through vias 31 may also be filled at the same time during the electro-less deposition process.

Leveraging the PCB type plating processes, subsequent processes may also be combined as much as possible. So, for example, the patterned resist layer 75 are deposited (FIG. 8) by sequentially coating on either side of the laminate substrate 10, then sequentially exposing one side at a time. However, the developing and etching may be advantageously carried out at the same time for both sides by submerging the laminate substrate 10 into a suitable developer or etchant.

Alternatively in one embodiment, a electroplating process may be used. In such an embodiment, a seed layer 55 is optionally formed over the top surface and the opposite bottom surface of the laminate substrate 10. The seed layer 55 is optional because the upper metal layer 40 over the laminate substrate 10 may be used as a seed layer. The seed layer 55 may be formed using a metal deposition process such as sputtering, vapor deposition processes including chemical vapor deposition (CVD), plasma vapor deposition (PVD). The seed layer 55, if formed, is covered. The seed layer 55 may be formed over the entire surface as a blanket layer including over the non-metallic areas of the laminate substrate 10.

A thick metal layer 65 is formed over the seed layer 55 over the top surface and the opposite bottom surface of the laminate substrate 10. In various embodiments, the thick metal layer 65 may be formed over seed layer 55 using electro-deposition process such as electroplating. In an alternative embodiment, the front side 11 and the back side 12 of the laminate substrate 10 are subjected to an electroless deposition process. The thick metal layer 65 may be deposited as a blanket layer after which the metal layer 65 may be patterned in one embodiment as illustrated in FIG. 7.

The seed layer 55 and the thick metal layer 65 may be formed over the front side 11 and then the laminate substrate 10 may be placed over another carrier. The seed layer 55 and the thick metal layer 65 may be formed over the back side 12. The seed layer 55 and the thick metal layer 65 may also fill the through openings 30 so as to form through vias 31.

In an alternative embodiment, a resist layer is formed over the seed layer 55. The resist layer is patterned so that only regions of the seed layer 55 over which the thick metal layer 65 is to be formed is exposed. Thus, the thick metal layer 65 is structured during deposition as in a damascene process. The resist layer may be removed after depositing the thick metal layer 65.

Figure 8:
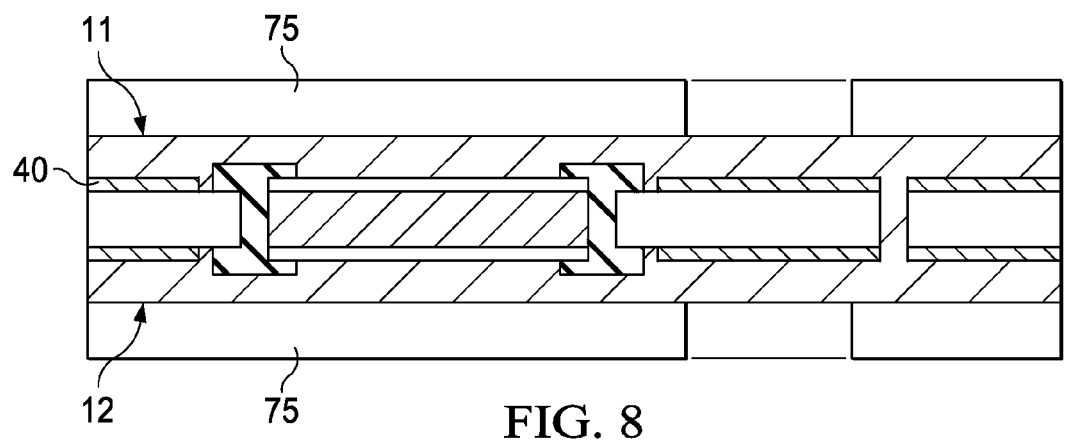
FIG. 8 illustrates a cross-sectional view of the semiconductor package being fabricated after forming a patterned resist layer over the laminate substrate in accordance with an embodiment of the invention.

FIG. 8 illustrates a cross-sectional view of the semiconductor package being fabricated after forming a patterned layer over the laminate substrate in accordance with an embodiment of the invention.

Referring to FIG. 8, a patterned resist layer 75 is formed over the thick metal layer 65. The patterned resist layer 75 protects the regions of the thick metal layer 65 that are not to be removed. In other words, the patterned resist layer 75 represents the circuit layout of the package. The patterned resist layer 75 may be formed by depositing a photoresist material and patterning using conventional lithography processes. The photoresist material may be coated over the laminate substrate 10 or alternatively may be applied as a dry film or sheet. The patterned resist layer 75 may comprise an organic material such as a photo resist in one embodiment.

In an alternative embodiment, the patterned resist layer 75 comprises a metallic layer. The metallic layer may be applied using an organic resist to pattern plate. In PCB production, the copper is often removed using ferric-chloride, cupric chloride, sulfuric-peroxide, or ammoniacal etching. The etchant used largely determines the material of the patterned resist layer 75. For example, metallic resists are not optimal for use with cupric chloride while ammoniacal etchants are suited for use with most resists. Sulfuric-peroxide is also compatible with metallic resists.

For fine definition processing, a plating resist may be created as a negative (i.e. over the copper to be removed) and a hard etch mask is made using metals such as tin, tin-lead, gold, and others. Next, the resist metal such as tin may be plated. The plating resist is then removed leaving the plated resist metal, which forms the patterned resist layer 75.

The advantages of this process is that the metal such as tin adheres much better to the surface than an organic resist, so resist lifting, peeling and under-etching are reduced. This also allows the formation of finer geometries thus achieving higher reliability during etching.

Alternatively, in another embodiment, a laser ablation process may be used for structuring, especially when patterning very thin metal layers. The entire surface of the metal layer 65 may be coated with tin, and then structured with a laser. The result is the same as producing the tin as a pattern plate.

Figure 9A:
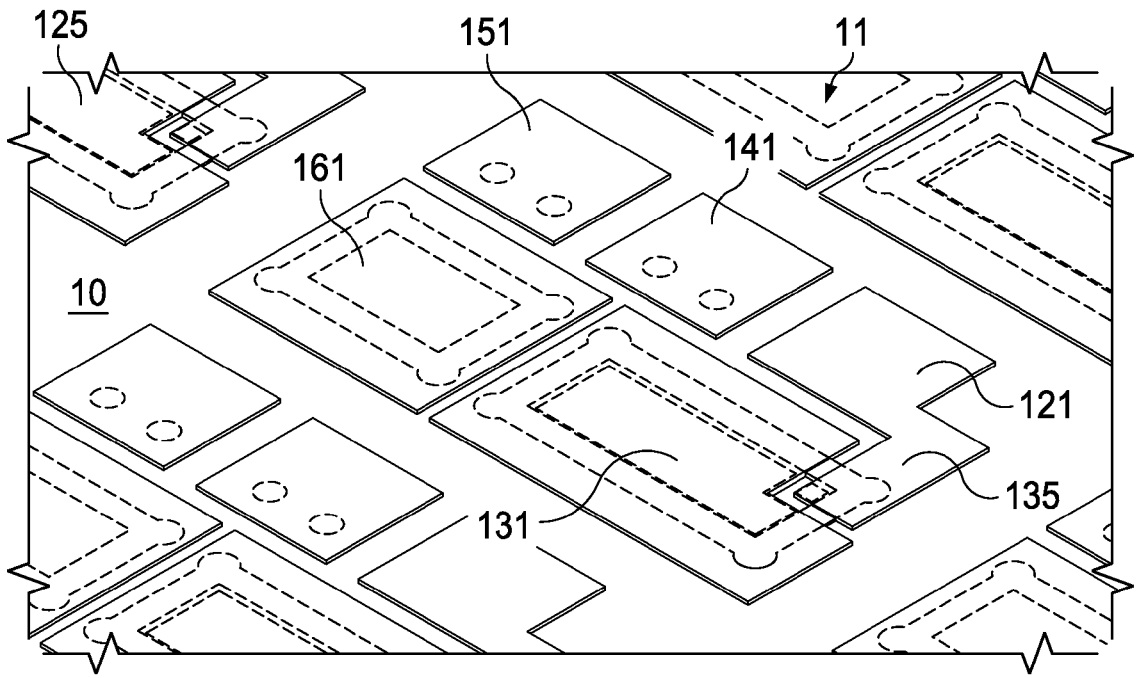
Figure 9B:
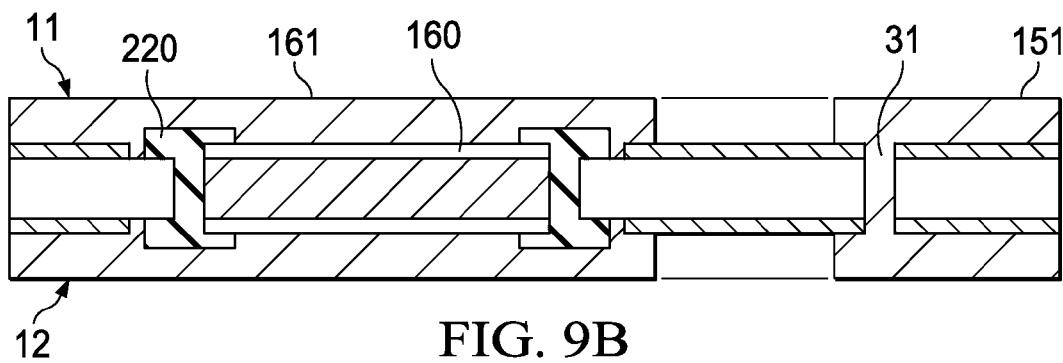

FIG. 9, which includes FIGS. 9A and 9B, illustrates the semiconductor package being fabricated after forming the circuit interconnecting the dies in accordance with an embodiment of the invention.

As next illustrated in FIG. 9, using the patterned resist layer 75 as an etch mask, the circuit layout is defined by etching the exposed thick metal layer 65 and, if necessary, the seed layer 55. Any exposed metallic layer underneath the thick metal layer 65 may be removed. For example, the upper metal layer 40 on the top surface of the laminate substrate 10 may be etched and removed to avoiding shorting. The patterned resist layer 75 is removed after etching the exposed thick metal layer 65 and the seed layer 55. After etching the exposed thick metal layer 65, the metal such as tin, which forms the patterned resist layer 75 is removed in a selective tin etch process.

Thus, after the patterning of the thick metal layer 65 and the seed layer 55, a plurality of contact pads 125 are formed over the laminate substrate 10. The plurality of contact pads 125 may be connected to the contact areas on the dies by redistribution lines 135.

The plurality of contact pads 125 include a first gate contact 121 coupled to the first gate contact region 115 through redistribution lines 135. The plurality of contact pads 125 include a first source contact 131 coupled and disposed over the first source contact region 130.

The plurality of contact pads 125 may include a second drain contact 161 disposed over and coupled to the second drain contact region 160. The plurality of contact pads 125 include a second gate contact 151 coupled to the second gate contact region 150 through back side redistribution lines and through vias 31. Similarly, a common source/drain contact 141 is coupled to the first drain contact region 140 and the second source contact region 170 using backside redistribution lines and through vias 31.

Figure 10A:
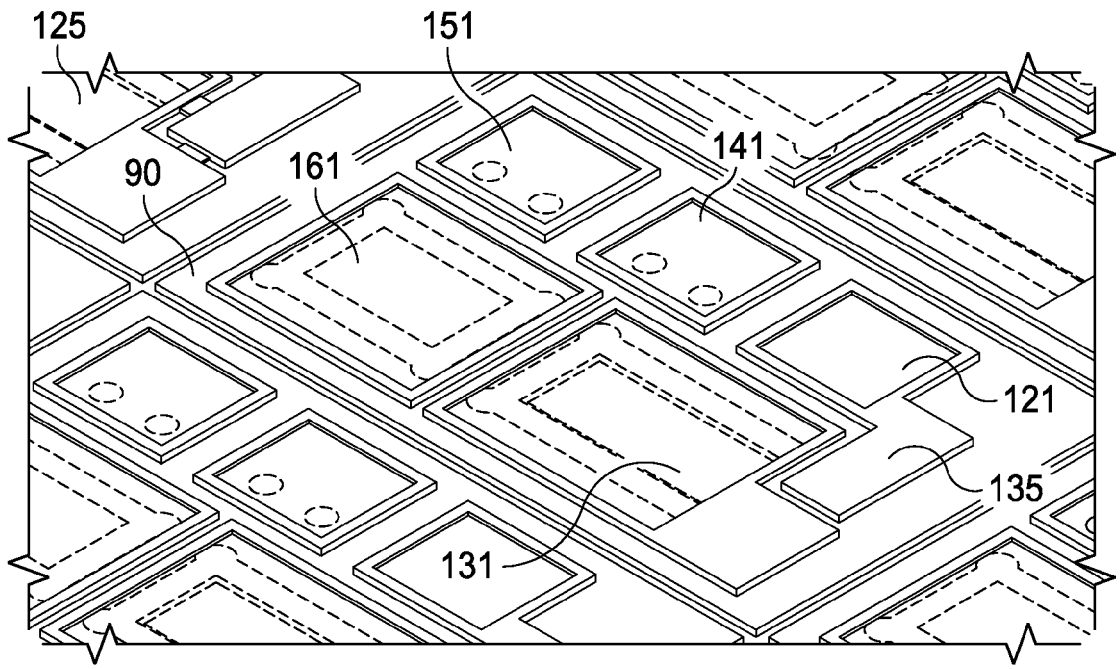
Figure 10B:
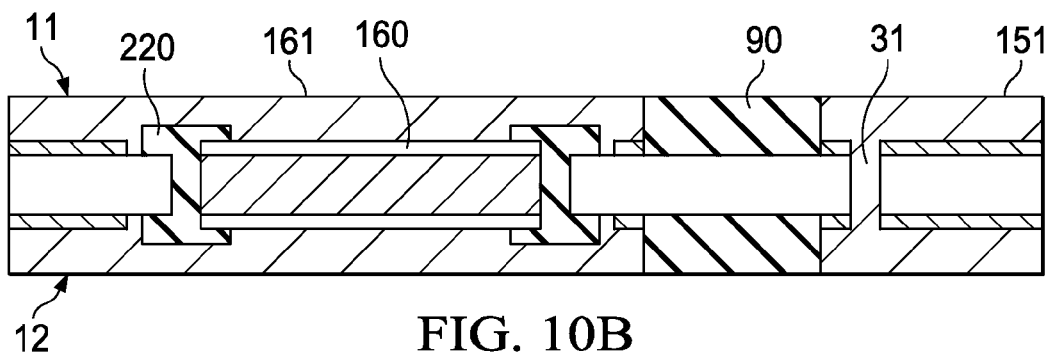

FIG. 10, which includes FIGS. 10A and 10B, illustrates the semiconductor package being fabricated after forming a solder mask in accordance with an embodiment of the invention, wherein FIG. 10A illustrates a top view and FIG. 10B illustrates a cross-sectional view.

Referring next to FIG. 10, a dielectric layer 90 (solder mask) may be formed over and under the laminate substrate 10. The dielectric layer 90 may be an organic material in one embodiment. The dielectric layer 90 may be fabricated from a polymer, such as poly (p-xylylene) (parylene), photo resist material, imide, epoxy, epoxy resin, duroplast, silicone, or ceramics such as materials comprising carbon and silicone. In various embodiments, the dielectric layer 90 may be deposited as a liquid or paste using screen printing, curtain coating, flood coating, spraying etc. or by using a dry-film laminate or sheet. The dielectric layer 90 may be deposited from a gas phase or from a solution, or can be printed or laminated in some embodiments. The dielectric layer 90 may be used to further define the circuit connectivity or to protect one or more nodes of the circuit with different potentials.

Figure 11:
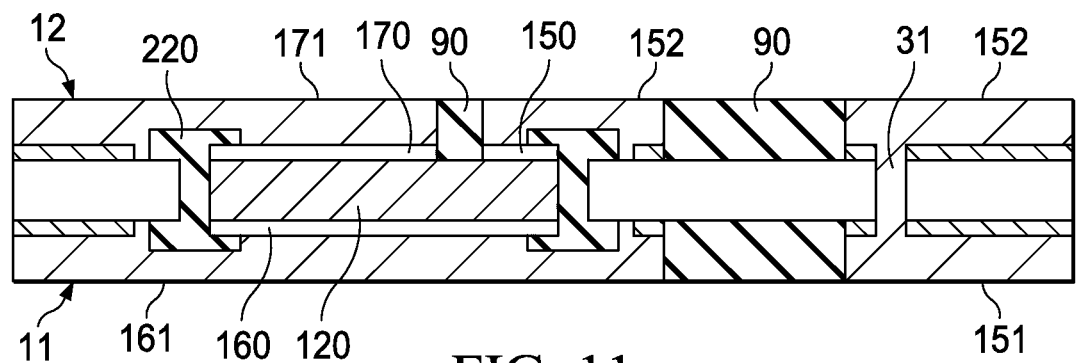
FIG. 11 illustrates a cross-sectional view of the semiconductor package after forming the circuit layout and solder mask in accordance with embodiments of the invention.

FIG. 11 illustrates a cross-sectional view of the semiconductor package after forming the circuit layout and solder mask over both the front side and back side in accordance with embodiments of the invention.

As described above, in various embodiments, the process steps (FIGS. 7-10) may be performed sequentially first on the front side 11, and then the process steps may be repeated on the back side 12. Alternatively, in some embodiments, a process step may be performed first on one side and then immediately over the other side.

Referring to FIG. 11, the laminate substrate 10 is placed over a carrier 51 so that the front side 11 is below and the back side 12 is above. The contacts on the back side 12 have been fabricated, in one embodiment as described above, in FIGS. 7-10.

The second source contact region 170 on the back surface of the second die 120 is coupled to second source contact conductor 171 and coupled to the common source/drain contact 141 through backside redistribution lines (similar to the front side redistribution lines 135) and a through via 31. The second gate contact region 150 is coupled to the second gate contact on the front side 11 through a through via 31 and back side gate conductors 152.

Figure 12A:
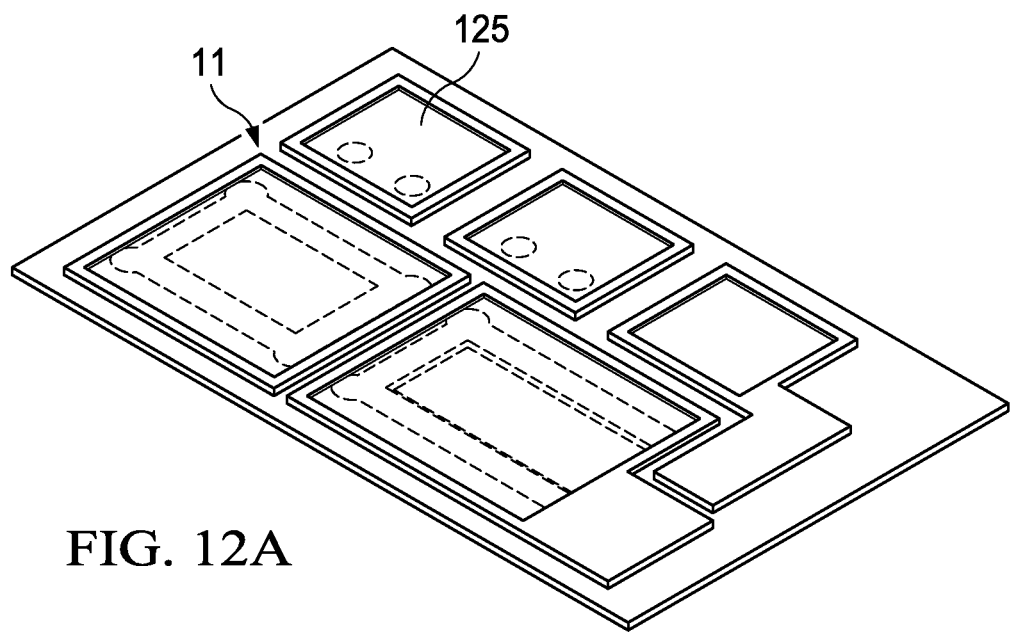
Figure 12B:
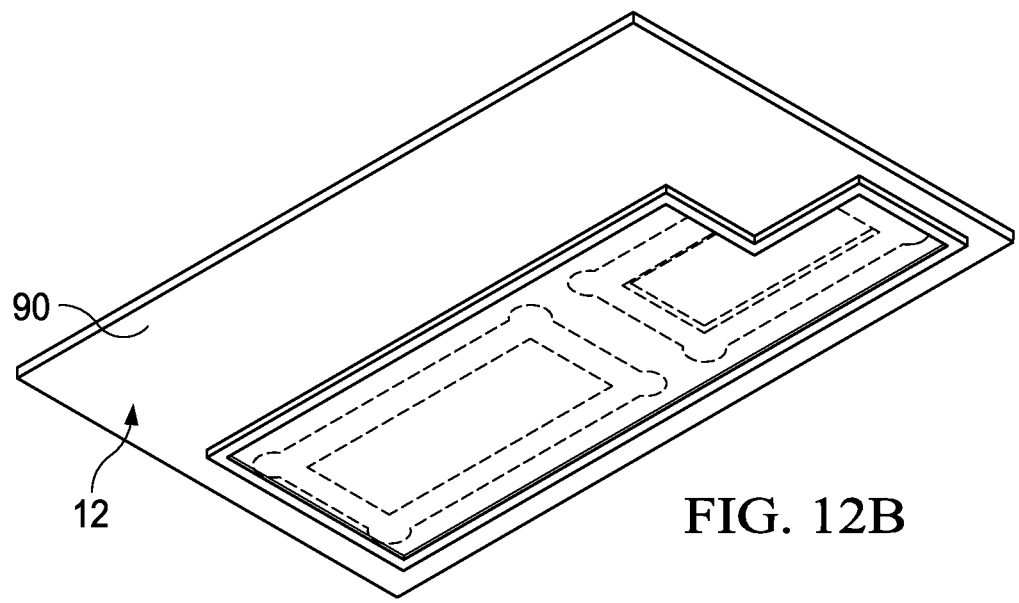

FIG. 12, which includes FIGS. 12A and 12B, illustrates a semiconductor package after singulation in accordance with embodiments of the invention, wherein FIG. 12A illustrates the top side and FIG. 12B illustrates the back side.

The laminate substrate 10 may be singulated into semiconductor packages as illustrated in FIG. 12. FIG. 12A illustrates the contact pads 125 over the front side 11 of the laminate substrate 10 while FIG. 12B shows the back side conductor under the back side 12 of the laminate substrate 10.

Figure 13:
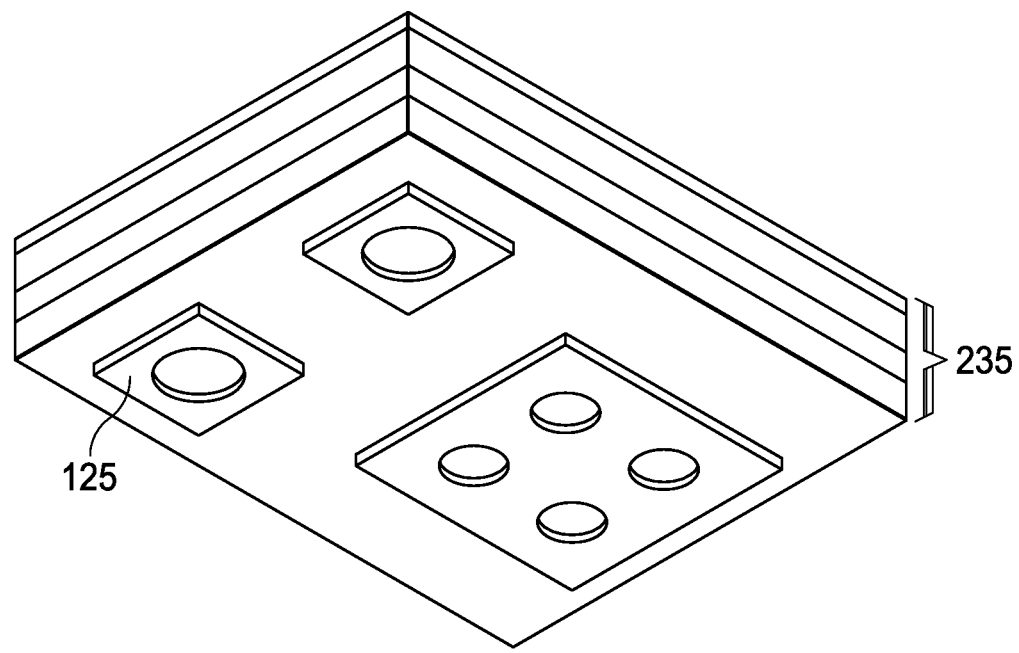
FIG. 13 illustrates a semiconductor package having an additional secondary lamination in accordance with an embodiment of the invention.

FIG. 13 illustrates a semiconductor package having an additional secondary lamination in accordance with an embodiment of the invention.

In some embodiments, a discrete or multi chip surface mount device (SMD) package so that the contacts are formed on one surface for connection to a printed circuit board (PCB). In some of these embodiments, an ultra-thin package formed according to embodiments described above may have issues such as arising from mechanical stability. This embodiment may be used to overcome any such limitations. In one or more embodiments, the circuit may be bonded to a stabilization layer such as a metal plate. In one embodiment, the stabilization layer may be added using a lamination process similar to a PCB lamination manufacturing process. This process may be referred as secondary lamination.

Referring to FIG. 13, a plurality of contacts 125 are formed on one surface forming a SMD. A composite layer 235 is laminated onto the back of the package rather than a metal plate in one embodiment of the invention. The secondary lamination to a carrier advantageously has further distinct benefits in that a thick metal layer can be fully isolated or the node to which it is connected may be chosen. This is very beneficial to applications that have heat-sinking as the connection of the heat-sink does not require the added complexity of electrical isolation.

In various embodiments other types of packages may also be fabricated using embodiments of the invention. For example, the embodiments of the invention also include fabrication of devices illustrated in application Ser. No. 13/180, 630, filed on Dec. 7, 2011, which application is herein incorporated by reference.

The semiconductor package thus formed may be integrated into a multi-layer printed circuit board (PCB) stack in various configurations. The semiconductor package may be used as a full circuit stage, for example, as a "daughterboard" or "piggy-back board," which is an extension circuit board or "daughter" of a motherboard or a card.

Embodiments of the present invention advantageously use sequential build up technologies. This reduces waste products during the wafer level packaging. For example, thick metal layers are deposited only where required. Materials do not need to be removed or machined with expensive and difficult processing technologies. Further, in various embodiments, many of the processes are completed as double sided operations. For example, plating, photo-resist developing, etching, and solder mask developing are carried out together to reduce process steps.

Embodiments of the invention use photo-imaging dielectrics, which result in a process that allows large flexibility in the shape, area, and mix of aperture size and form. This photo-imaging process produces a very thin, e.g., about 6 μm to about 40 μm dielectric layer. The photo-imaging process creates virtually no surface topology, therefore it is possible to open a very small connection as well as very large ones. So, for example, a small aperture may be placed next to a very large aperture. For example, a 25 μm round aperture may be produced next to a square aperture of 100 mm². The subsequent plating technology is also very simple because of the flat topology and therefore complexities of blind-via plating are avoided.

Advantageously, in various embodiments, the dies remain visible through much of the early processing. Therefore, complicated procedures relating to finding the die or blind processing are avoided using embodiments of the invention. The following paragraphs describe the processes of building an embedded semiconductor packaging structure.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1 may be combined with the embodiments described in FIG. 13. Similarly, the embodiments of the present invention may be combined with embodiments described in co-pending application, application Ser. No. 13/232,803, filed on Sep. 14, 2011, which application is incorporated herein by reference thereby forming electronic modules having a passive component. It is therefore intended that the appended claims encompass any such modifications or embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor package, the method comprising:
   forming a die opening in a laminate substrate, the laminate substrate having a front side and a back side;
   placing a die within the die opening; and
   forming a spacer around the die, the spacer disposed between the laminate substrate and an outer sidewall of the die, the spacer partially extending over a portion of the die, the forming of the spacer including depositing a spacer material in a first region around a perimeter of the die, and removing a portion of the spacer material from the first region to form the spacer.

2. The method of claim 1, wherein the laminate substrate has a upper conductive layer over the front side of the laminate substrate and a lower conductive layer under the back side of the laminate substrate, the method further comprising removing a portion of the upper and the lower conductive layers from the front side and the back side around the die opening.

3. The method of claim 1, further comprising placing the laminate substrate on a carrier before placing the die within the die opening.

4. The method of claim 1, further comprising:
   coating a metallic material so as to cover the front side of the laminate substrate, a top surface of the spacer, and the top surface of the die;
   forming a circuit layout comprising the metallic material coating and a thick conductive layer formed over the metallic material coating; and
   forming a solder mask covering portions of the circuit layout.

5. The method of claim 1, further comprising:
   forming a through opening on the laminate substrate while forming the die opening; and
   forming a through via with a metal by filling the through opening after forming the spacer.

6. A semiconductor package comprising:
   a substrate having a first die opening;

a first die disposed within the first die opening; and a first spacer disposed within a first gap between the laminate substrate and the first die, the first spacer disposed around a perimeter of the first die, the first spacer formed by depositing a spacer material in a first region around a perimeter of the first die, and removing a portion of the spacer material from the first region to form the first spacer.

7. The package of claim 6, wherein the first spacer comprises an insulating material.

8. The package of claim 6, further comprising:

a second die disposed within a second die opening within the substrate, the first die isolated from the second die by a portion of the substrate; and a second spacer disposed within a second gap between the substrate and the second die, the second spacer disposed around a perimeter of the second die and having an "I" shaped structure.

9. A method, comprising:

providing a substrate with at least one opening having at least one substrate side surface;

depositing a die in the at least one opening, the die having at least one die side surface facing the at least one substrate side surface; and forming at least one spacer between the at least one die side surface and the at least one substrate side surface, the forming of the at least one spacer including depositing a spacer material in a first region around a perimeter of the die, and removing a portion of the at least one spacer material from the first region to form the at least one spacer.

10. The method according to claim 9, wherein the spacer contacts the at least one die side surface and the at least one substrate side surface.

11. The method according to claim 9, wherein the substrate includes a substrate front surface and a substrate back surface, and the die includes a die front surface and a die back surface, the forming act further forms the at least one spacer over a portion of the substrate front surface and a portion of the die front surface.

12. The method according to claim 11, wherein the forming act further forms the at least one spacer over a portion of the substrate back surface and the die back surface.

13. The method according to claim 11, further comprising placing the substrate and the die, including the at least one spacer formed between the at least one die side surface and the at least one substrate side surface, over a carrier, the placing causing the at least one spacer to contact the carrier and further causing a gap to form between the substrate front surface and the carrier and between the die front surface and the carrier.

14. The method according to claim 11, wherein the forming act further forms the at least one spacer over a portion of the substrate back surface and a portion of the die back surface.

15. An apparatus, comprising:

a substrate;

a die being adjacent the substrate; and a spacer being placed between the die and the substrate, the spacer at least in contact with three surfaces of the substrate and being a contiguous structure formed by a curing process that integrates at least two portions of the spacer.

16. The apparatus according to claim 15, wherein the spacer is further at least in contact with three surfaces of the die.

17. The apparatus according to claim 15, wherein the spacer is in contact with side, front and bottom surfaces of the substrate, and further in contact with side, front and bottom surfaces of the die.

18. The apparatus according to claim 15, wherein the substrate includes an opening, the die being positioned in the opening and the spacer being placed between a surface defining at least a portion of the opening and a lateral surface of the die.

19. A spacer to separate components, comprising:

a first recess to accommodate a first semiconductor component; and a second recess to accommodate a second semiconductor component, wherein the first recess is limited to protecting an edge of the first semiconductor component and the second recess is limited to protecting an edge of the second semiconductor.

20. The spacer according to claim 19, wherein the spacer is formed from a polymer material.

21. The spacer according to claim 19, wherein the spacer is formed from a thermally curable material.

22. The spacer according to claim 19, wherein the first semiconductor component is a laminate substrate and the second semiconductor component is a die.

23. The spacer according to claim 19, wherein the spacer has an "I" shape.

24. The spacer according to claim 19, wherein the first recess is smaller than the second recess.

* * * * *